United States Patent
Langer (10) Patent No.: US 9,520,841 B2
(45) Date of Patent: *Dec. 13, 2016

(54) TRANSMIT CIRCUIT, METHOD FOR ADJUSTING A BIAS OF A POWER AMPLIFIER AND METHOD FOR ADAPTING THE PROVISION OF A BIAS INFORMATION

(71) Applicant: Intel Deutschland GmbH, Neubiberg (DE)

(72) Inventor: Andreas Langer, Unterschleissheim (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/808,140

(22) Filed: Jul. 24, 2015

(65) Prior Publication Data

US 2015/0333711 A1  Nov. 19, 2015

Related U.S. Application Data (60) Continuation of application No. 14/273,672, filed on May 9, 2014, now Pat. No. 9,124,316, which is a
(Continued)

(51) Int. Cl.
*H04B 1/04* (2006.01)
*H03F 1/56* (2006.01)
(Continued)

(52) U.S. Cl.
CPC .............. *H03F 1/56* (2013.01); *H03F 1/3241* (2013.01); *H03F 3/19* (2013.01); *H03F 3/21* (2013.01);
(Continued)

(58) Field of Classification Search
CPC ......... H04B 1/0458; H03F 1/3241; H03F 3/24
(Continued)

(56) References Cited

U.S. PATENT DOCUMENTS 5,216,379 A   6/1993  Hamley
6,639,471 B2 * 10/2003 Matsuura .............. H03F 1/0238
330/285

(Continued)

FOREIGN PATENT DOCUMENTS

CN   1682440 A    10/2005
DE   102004047684 A1  6/2005

OTHER PUBLICATIONS

Non-Final Office Action dated Feb. 26, 2013 for U.S. Appl. No. 13/191,685.
(Continued)

*Primary Examiner* — Tuan Pham
(74) *Attorney, Agent, or Firm* — Eschweiler & Associates, LLC (57) ABSTRACT

A transmit circuit includes an envelope tracker configured to determine an envelope of a transmit signal and provide bias information based on the determined envelope of the transmit signal. The transmit circuit further includes a power amplifier configured to generate an RF output signal based on the transmit signal, a bias provider configured to provide a bias for the power amplifier based on the bias information, and an impedance determinator configured to determine a measure of a load impedance of a load coupled to an output of the power amplifier. The envelope tracker is configured to adapt the bias information based on the measure of the load impedance.

12 Claims, 7 Drawing Sheets

Related U.S. Application Data division of application No. 13/191,685, filed on Jul. 27, 2011, now Pat. No. 8,761,698.

(51) Int. Cl.
- *H03F 3/21* (2006.01)
- *H03F 1/32* (2006.01)
- *H03F 3/24* (2006.01)
- *H03F 3/19* (2006.01)

(52) U.S. Cl.
CPC ............... *H03F 3/24* (2013.01); *H03F 3/245* (2013.01); *H04B 1/04* (2013.01); *H04B 1/0458* (2013.01); *H03F 2200/102* (2013.01); *H03F 2200/129* (2013.01); *H03F 2200/451* (2013.01); *H04B 2001/0408* (2013.01); *H04B 2001/0416* (2013.01)

(58) Field of Classification Search
USPC ............ 455/522, 91, 114.3, 115.1, 121, 127.1, 455/127.2, 107; 330/285, 296, 279, 302

See application file for complete search history.

(56) References Cited

U.S. PATENT DOCUMENTS

| | | |
|---|---|---|
| 6,725,021 B1 | 4/2004 | Anderson et al. |
| 6,762,647 B1 | 7/2004 | Apel |
| 7,062,236 B2 | 6/2006 | Midtgaard et al. |
| 7,276,973 B2 | 10/2007 | Ripley et al. |
| 7,359,681 B2 | 4/2008 | Cho |
| 8,294,514 B2 | 10/2012 | Visser et al. |
| 2005/0105642 A1* | 5/2005 | Muller ............... H03F 1/3247 375/296 |
| 2005/0111574 A1 | 5/2005 | Muller et al. |
| 2007/0026838 A1 | 2/2007 | Staudinger et al. |
| 2009/0096533 A1 | 4/2009 | Paul et al. |
| 2009/0207896 A1 | 8/2009 | Behzad |
| 2011/0151808 A1 | 6/2011 | Agarwal |
| 2011/0175681 A1* | 7/2011 | Inamori ............... H03F 1/0211 330/296 |
| 2011/0298539 A1* | 12/2011 | Drogi ............... H03F 1/0227 330/129 |

OTHER PUBLICATIONS

Final Office Action dated Aug. 15, 2013 for U.S. Appl. No. 13/191,685.

Non-Final Office Action dated Oct. 23, 2013 for U.S. Appl. No. 13/191,685.

Notice of Allowance dated Feb. 21, 2014 for U.S. Appl. No. 13/191,685.

Notice of Allowance dated Feb. 24, 2015 for U.S. Appl. No. 14/273,672.

* cited by examiner

TRANSMIT CIRCUIT, METHOD FOR ADJUSTING A BIAS OF A POWER AMPLIFIER AND METHOD FOR ADAPTING THE PROVISION OF A BIAS INFORMATION

REFERENCE TO RELATED APPLICATION

This application is a continuation of U.S. application Ser. No. 14/273,672 filed on May 9, 2014 which is a divisional of U.S. application Ser. No. 13/191,685 filed on Jul. 27, 2011.

FIELD

Embodiments of the invention relate to a transmit circuit, a method for adjusting a bias of a power amplifier and a method for adapting the provision of bias information. Further embodiments of the invention relate to a control of power amplifier output power headroom in an antenna tuner based system.

BACKGROUND

Conventional methods for adjusting a bias of a power amplifier comprise, for example, methods for reducing a bias current of the power amplifier based on a detected output power level. Such a reduction of the bias current is performed by using a conventional bias control approach. The bias control comprises, for example, a control of a driver for changing the supply voltage of the power amplifier based on certain input parameters. Conventional mobile communication devices including such a bias control are based, for example, on Wideband Code Division Multiple Access (WCDMA). WCDMA describes a multiple access method, while Universal Mobile Telecommunications System (UMTS) is the standard based thereon.

SUMMARY

Embodiments of the invention provide a transmit circuit, wherein the transmit circuit comprises a power amplifier for amplifying an RF input signal to obtain an RF output signal, and an antenna tuner for transforming an antenna impedance to an impedance at an input of the antenna tuner, wherein the input of the antenna tuner is coupled to an output of the power amplifier. The transmit circuit further comprises a bias controller for controlling a bias of the power amplifier. The bias controller is configured to provide a bias control signal to adjust the bias of the power amplifier based on a determination of a measure of a load impedance provided to the power amplifier by the antenna tuner.

Embodiments of the invention provide a transmit circuit, wherein the transmit circuit comprises a power amplifier for amplifying an RF input signal based on a supply voltage to obtain an RF output signal, and an antenna tuner for transforming an antenna impedance to an impedance at an input of the antenna tuner, wherein the input of the antenna tuner is coupled to an output of the power amplifier. The transmit circuit also comprises a bias controller for controlling a bias of the power amplifier. The bias controller comprises an impedance determinator for determining a measure of a load impedance provided to the power amplifier by the antenna, a bias information provider for providing a bias information in dependence on the measure of the load impedance, and a DCDC converter for adjusting the supply voltage of the power amplifier based on the bias information. The bias information provider is configured to provide the bias information such that a parameter of the RF output signal lies within a predefined range for a plurality of load impedances determined by the impedance determinator. The bias controller is also configured to: provide a first bias control signal to set the bias of the power amplifier to a comparatively high level during an initial transmission time interval or after an occurrence of a frequency change in a hopping sequence, determine the measure of the load impedance provided to the power amplifier by the antenna tuner, provide a second bias control signal that is different from the first bias control signal to adjust the bias of the power amplifier to a comparatively lower level based on the determination of the measure of the load impedance for a consecutive time interval, and increase the bias level of the power amplifier by providing an increased bias control signal in response to a detection of a change of the measure of the load impedance which exceeds a predefined threshold. Additionally, the bias controller is configured to set the bias of the power amplifier to the comparatively high level as long as a current measure of the load impedance is unavailable or as long as the load impedance presented to the power amplifier by the antenna tuner has not reached a predetermined impedance region. Furthermore, the bias controller is configured to reduce the bias of the power amplifier as soon as the load impedance presented to the power amplifier by the antenna tuner is brought into the predetermined impedance region by the antenna tuner.

Embodiments of the invention provide a transmit circuit, wherein the transmit circuit comprises an envelope tracker for determining an envelope of a transmit signal and for providing bias information based on the envelope of the transmit signal. The transmit circuit also comprises a power amplifier for obtaining an RF output signal based on the transmit signal, a bias provider for providing a bias for the power amplifier based on the bias information, and an impedance determinator for determining a measure of a load impedance of a load coupled to an output of the power amplifier. The envelope tracker is configured to adapt the provision of the bias information based on the measure of the load impedance.

Embodiments of the invention provide a method for adjusting a bias of a power amplifier. The method comprises amplifying an RF input signal using a power amplifier to obtain an RF output signal, and transforming an antenna impedance to an impedance at an input of an antenna tuner, wherein the input of the antenna tuner is coupled to an output of the power amplifier. The method also comprises controlling the bias of the power amplifier. Controlling the bias comprises providing a bias control signal to adjust the bias of the power amplifier based on a determination of a measure of a load impedance provided to the power amplifier by the antenna tuner.

Embodiments of the invention provide a method for adapting the provision of bias information. The method comprises determining an envelope of a transmit signal, providing a bias information based on the envelope of the transmit signal, and obtaining an RF output signal based on the transmit signal using a power amplifier. The method also comprises providing a bias for the power amplifier based on the bias information, determining a measure of a load impedance of a load coupled to an output of the power amplifier, and adapting the provision of the bias information based on the measure of the load impedance.

BRIEF DESCRIPTION OF THE DRAWINGS

Embodiments according to the present invention will subsequently be described in reference to the enclosed figures in which.

DETAILED DESCRIPTION

In the following, operation conditions and requirements of some mobile communication devices, in which the present invention may be used, will be described. Some embodiments according to the invention provide good performance under the condition discussed in the following.

Mobile terminals often have to cope with changing environmental conditions. The operating temperature range is typically between −10° C. up to 55° C. (according to 3GPP), while the supply voltage is typically between 3.0V and 4.3V. The latter is determined by the battery discharge characteristic and voltage drop during transmit operation. In addition, the radiated power of a mobile terminal strongly depends on the antenna conditions, e.g. free space, talk position (antenna covered by hand or close to head). The different antenna conditions result in different load impedances effective at the power amplifier output. Typically, the power amplifier has to cope with a wide range of load impedances. In the past, however, most of the power amplifiers were optimized for 50 Ohm conditions. Also, in the power amplifier specification, special care was not taken regarding mismatch (despite requirements for ruggedness and stability). Especially, power into a mismatched load was neglected, which increased the effort for antenna and RF development (e.g. optimized post power amplifier matching and antenna matching). Since the radiated power was not satisfying, the network operator started to define specific requirements, so called TRP (Total Radiated Power) requirements, especially driven by the US where the coverage is worse than e.g. Europe.

Therefore, a need exists for an approach for adjusting a bias of a power amplifier allowing to achieve a good trade-off between an improved radiated performance, a low current consumption and the computation complexity.

Embodiments of the invention achieve the just-mentioned good trade-off by transforming an antenna impedance to an impedance at an input of an antenna tuner, wherein the input of the antenna tuner is coupled to an output of a power amplifier, and by providing a bias control signal for adjusting a bias of the power amplifier based on a determination of a measure of a load impedance provided to the power amplifier by the antenna tuner. In this way, it is possible to avoid a degradation of the radiated performance during an impedance matching performed by the antenna tuner, so that the key parameters of the performance can be maintained with comparatively low effort and/or comparatively low current consumption.

Figure 1:
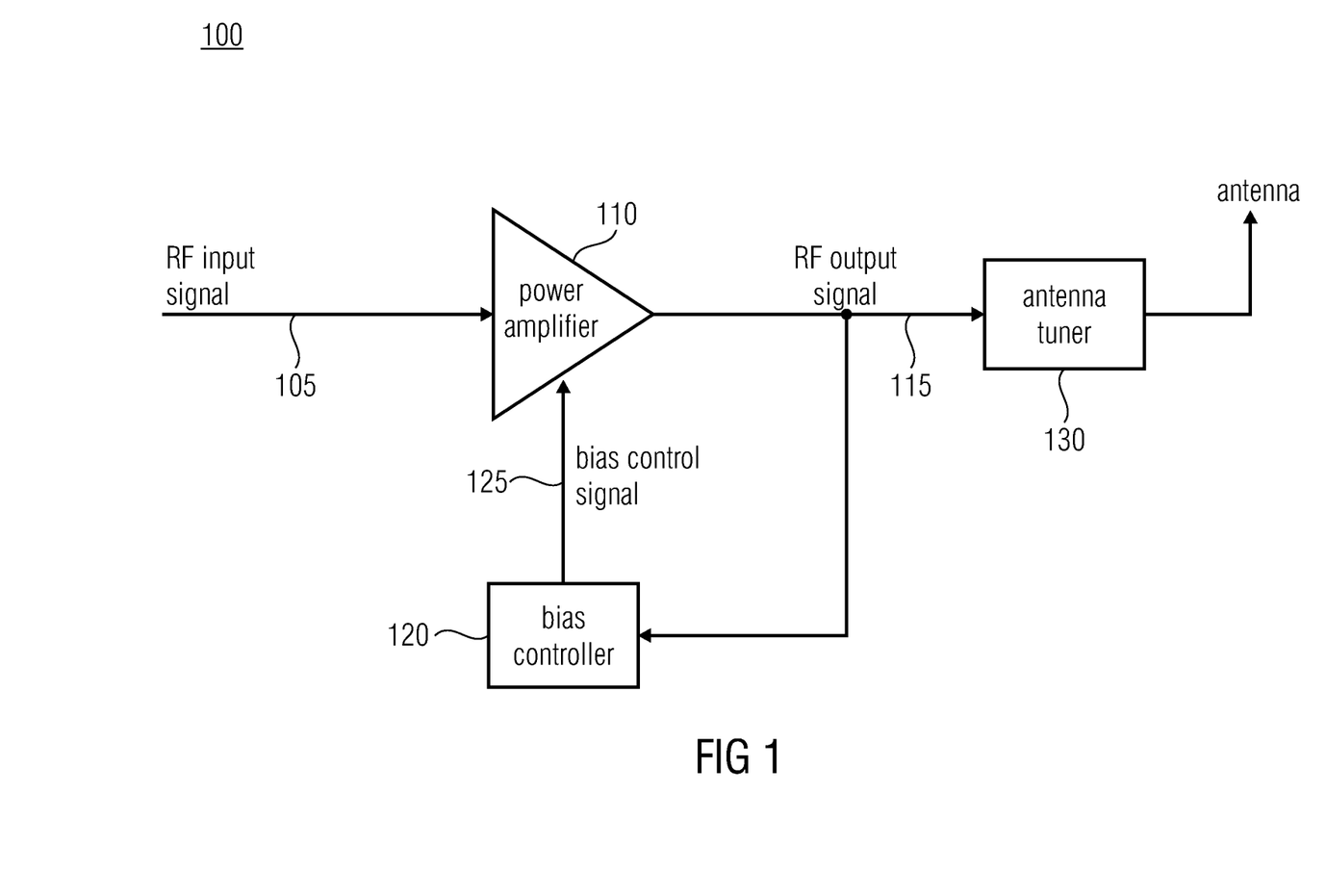
FIG. 1 shows a block diagram of an embodiment of a transmit circuit including an antenna tuner and a bias controller.

FIG. 1 shows a block diagram of an embodiment of a transmit circuit 100 including an antenna tuner 130 and a bias controller 120. As shown in FIG. 1, the transmit circuit 100 comprises a power amplifier 110, the antenna tuner 130 and the bias controller 120. Here, the power amplifier 110 is configured to amplify an RF input signal 105 to obtain an RF output signal 115. The antenna tuner 130 is configured to transform an antenna impedance to an impedance at an input of the antenna tuner 130, wherein the input of the antenna tuner 130 is coupled to an output of the power amplifier 110. Moreover, the bias controller 120 is configured to control a bias of the power amplifier 110. The RF input signal 105 may comprise a plurality of frequencies in specific frequency bands, such as defined by the UMTS standard (or may be switchable between a plurality of frequencies). Referring to the embodiment of FIG. 1, the bias controller 120 is configured to provide a bias control signal 125 to adjust the bias of the power amplifier 110 based on a determination of a measure of a load impedance provided to the power amplifier 110 by the antenna tuner 130. Such a measure of the load impedance is, for example, a quantity that is dependent on the load impedance. The RF output signal 115 obtained at the output of the power amplifier 110 represents an amplified version of the RF input signal 105.

Figure 2:
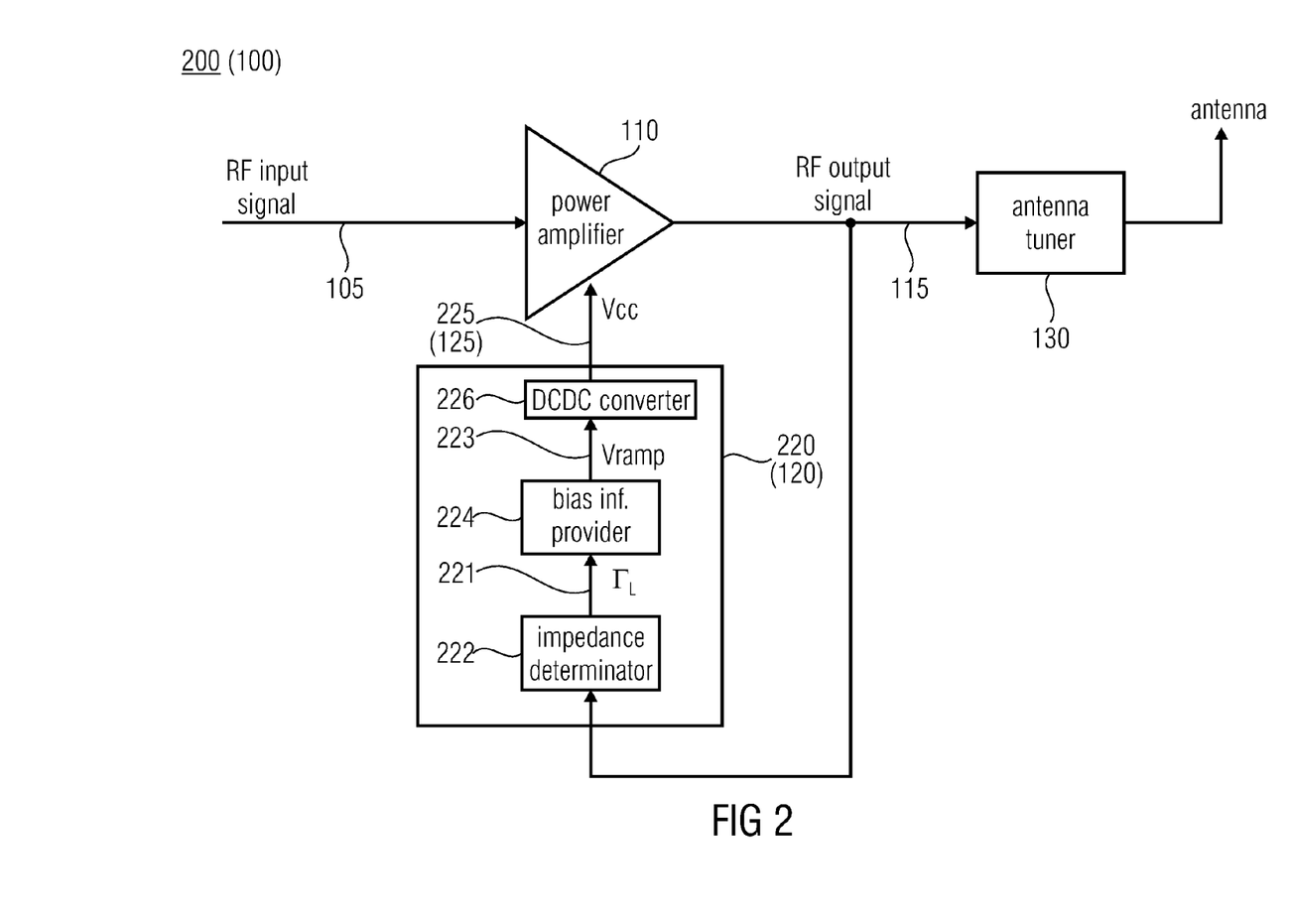
FIG. 2 shows a block diagram of a further embodiment of a transmit circuit including an antenna tuner and a bias controller with an impedance determinator, a bias information provider and a DCDC converter.

FIG. 2 shows a block diagram of a further embodiment of a transmit circuit 200 including an antenna tuner 130 and a bias controller 220 with an impedance determinator 222, a bias information provider 224 and a DCDC converter 226. Here, the transmit circuit 200 of FIG. 2 essentially comprises the same blocks as the transmit circuit 100 of FIG. 1. Therefore, identical blocks having similar implementations and/or functions are denoted by the same numerals. Moreover, the bias controller 220 and a power amplifier supply voltage 225, Vcc, of the transmit circuit 200 shown in FIG. 2 may correspond to the bias controller 120 and the bias control signal 125 of the transmit circuit 100 shown in FIG. 1. Referring to the embodiment of FIG. 2, the transmit circuit 200 comprises a power amplifier 110 for amplifying an RF input signal 105 based on the power amplifier supply voltage 225, Vcc, to obtain an RF output signal 115. The embodiment of FIG. 2 also includes an antenna tuner 130 for transforming an antenna impedance to an impedance at an input of the antenna tuner 130, wherein the input of the antenna tuner 130 is coupled to an output of the power amplifier 110. As can be seen in FIG. 2, the bias controller 220 of the transmit circuit 200 comprises an impedance determinator 222, a bias information provider 224 and a DCDC converter 226. Here, the impedance determinator 222 is configured to determine a measure 221, $\Gamma_L$, of a load impedance provided to the power amplifier 110 by the antenna tuner 130, for example in the form of a reflection factor $\Gamma_L$. The bias information provider 224 is configured to provide bias information 223 (e.g. a ramp voltage Vramp) based on the measure 221, $\Gamma_L$, of the load impedance. Here, $\Gamma_L$ is just a different representation of the load impedance as S-parameter considering a predetermined reference impedance. The DCDC converter 226 is configured to adjust the supply voltage 225 of the power amplifier 110 based on the bias information 223. In the embodiment of FIG. 2, the bias information provider 224 is configured to provide the bias information 223 such that a parameter of the RF output signal 115 lies within a predefined range for a plurality of load impedances determined by the impedance determinator 222. Here, the parameter of the RF output signal may correspond to an ACLR (Adjacent Channel Leakage Power Ratio) value, an EVM (Error Vector Magnitude) value or a saturated power value.

Figure 3:
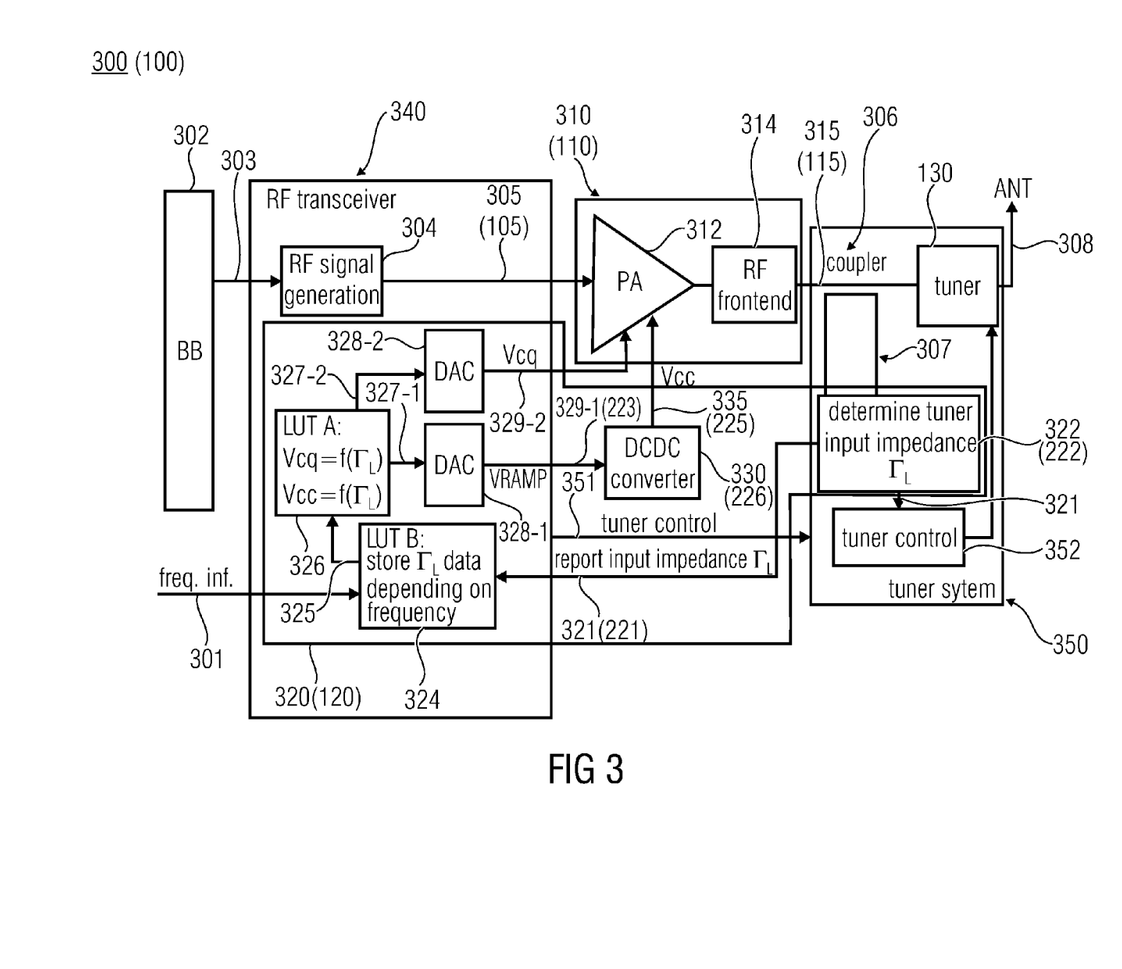
FIG. 3 shows a block diagram of a further embodiment of a transmit circuit including an antenna tuner and a bias controller with an impedance information look-up table.

FIG. 3 shows a block diagram of a further embodiment of a transmit circuit 300 including an antenna tuner 130 and a bias controller 320 with an impedance information look-up table 324 (LUT B). As shown in FIG. 3, the transmit circuit 300 comprises a power amplifier system 310, the antenna tuner 130, the bias controller 320 and a directional coupler 306. Here, the power amplifier system 310 and the bias controller 320 of the transmit circuit 300 shown in FIG. 3 may correspond to the power amplifier 110 and the bias controller 120 of the transmit circuit 100 shown in FIG. 1. In the embodiment of FIG. 3, a baseband generator 302 (baseband generator 'BB') and an RF signal generator 304 ('RF signal generation') are also shown. The baseband generator 302 is configured to generate a baseband signal 303, while the RF signal generator 304 is configured to generate an RF signal 305 on the basis of the baseband signal 303. It can be seen in FIG. 3 that the power amplifier system 310 is configured to receive the RF signal 305 from the RF signal generator 304 to obtain an RF output signal 315. Here, the RF signal 305 received by the power amplifier system 310 and the RF output signal 315 output by the power amplifier 310 as shown in the embodiment of FIG. 3 may correspond to the RF input signal 105 received by the power amplifier 110 and the RF output signal 115 output by the power amplifier 110 as shown in the embodiment of FIG. 1. Moreover, the power amplifier system 310 of FIG. 3 comprises a power amplifier 312 connected to an RF frontend 314. Referring to FIG. 3, the transmit circuit 300 may be divided into different parts, which may correspond to the power amplifier system 310, an RF transceiver 340 and a tuner system 350. The RF transceiver 340 comprises the RF signal generator 304, while the tuner system 350 comprises the antenna tuner 130 controlled by a tuner controller 352. The tuner controller 352 of the tuner system 350 may be configured to receive a tuner control signal 351 provided by the RF transceiver 340 for the tuner system 350.

According to embodiments, the directional coupler 306 of the transmit circuit 300 is coupled to the output of the power amplifier 312 or to the output of the RF frontend 314, such that it can be used to perform a measurement of the load impedance provided to the power amplifier system 310 (or to the power amplifier 312) by the antenna tuner 130.

Referring to the embodiment of FIG. 3, the antenna tuner 130 is configured to transform an antenna impedance (at an antenna 308) to an impedance at an input of the antenna tuner 130. Here, the input of the antenna tuner 130 is coupled to an output of the power amplifier system 310. The bias controller 320 of the transmit circuit 300 comprises an impedance determinator 322, an impedance information look-up table 324 (LUT B), a look-up table 326 (LUT A), a first digital-to-analog converter (DAC) 328-1, a second digital-to-analog converter (DAC) 328-2 and a DCDC converter 330. Here, the impedance determinator 322 is denoted by 'determine tuner input impedance $\Gamma_L$', while the impedance information look-up table 324 and the look-up table 326 are denoted by 'LUT B: Store $\Gamma_L$ data depending on frequency' and 'LUT A: Vcq=f($\Gamma_L$); Vcc=f($\Gamma_L$)', respectively. Moreover, the impedance determinator 322 and the DCDC converter 330 of FIG. 3 may correspond to the impedance determinator 222 and the DCDC converter 226 of FIG. 2.

According to the embodiment of FIG. 3, the directional coupler 306 is configured to provide a measurement signal 307 representing, for example, a complex load impedance and forward the provided measurement signal 307 to the impedance determinator 322 of the bias controller 320. The impedance determinator 322 may, in turn, be configured to determine the measure 321, $\Gamma_L$, of the (complex-valued) load impedance, such as a complex-valued reflection factor $\Gamma_L$, provided to the power amplifier 312 by the antenna tuner 130. Here, the measure 321, $\Gamma_L$, of the load impedance obtained by the impedance determinator 322 as shown in FIG. 3 may correspond to the measure 221, $\Gamma_L$, of the load impedance obtained by the impedance determinator 222 as shown in FIG. 2.

According to embodiments, the impedance determinator 322 may be part of the tuner system 350. Referring to FIG. 3, the impedance determinator 322 is configured to provide the measure 321 of the load impedance for the RF transceiver 340 or the impedance information look-up table 324. This is indicated in FIG. 3 by the arrow denoted by 'report input impedance $\Gamma_L$'. The tuner controller 352 of the tuner system 350 as shown in FIG. 3 may be configured to control the antenna tuner 130 for performing the antenna tuning (or impedance matching) based on the measure 321, $\Gamma_L$, of the load impedance provided by the impedance determinator 322 and on the tuner control signal 351 received from the RF transceiver 340.

In the embodiment of FIG. 3, the impedance information look-up table 324 of the bias controller 320 may be configured to store a plurality of values of a measure of a load impedance for corresponding frequencies of the RF input signal (RF signal 305). Here, the storing of the impedance values ($\Gamma_L$ data) is based on the impedance determination performed by the impedance determinator 322. In addition, the bias controller 320 is configured to extract an individual value 325 of the measure of the load impedance from the impedance information look-up table 324 (LUT B). Here, the individual value 325 of the measure of the load impedance may correspond to a frequency of the RF input signal 305 such as in a frequency hopping mode. Moreover, the bias controller 320 is configured to provide the bias control signal to adjust the bias of the power amplifier 312 based on the individual value 325 of the measure of the load impedance extracted from the impedance information look-up table 324. Accordingly, a currently measured impedance value 321 may be used as the value 325 of the impedance measure if the look-up table 324 does not comprise a stored, previously measured impedance value, and a stored, previously measured impedance value from the look-up table 324 may be used as the value 325 of the impedance measure otherwise.

Referring to FIG. 3, the bias controller 320 may comprise a look-up table 326 (LUT A) configured to store a plurality of bias voltage values (Vramp, Vcq) associated with corresponding values of the measure 321 of the load impedance for a plurality of load impedances provided to the power amplifier 312 by the antenna tuner 130. In addition, the bias controller 320 may be configured to extract an individual bias voltage value (Vramp; Vcq) from the look-up table 326 (LUT A), wherein the individual bias voltage value (Vramp; Vcq) corresponds to a value 325 of the measure of the load impedance determined by the bias controller 320. The bias controller 320 is furthermore configured to provide the bias control signal to adjust the bias of the power amplifier 312 based on the individual bias voltage value extracted from the look-up table 326.

For example, as depicted in the embodiment of FIG. 3, the bias controller 320 is configured to extract a first and a second digital bias voltage value 327-1, 327-2 from the look-up table 326 (LUT A) based on the individual value 325 of the measure of the load impedance extracted from the impedance information look-up table 324 (LUT B) or based on a determined impedance information 321. Here, the first and the second digital bias voltage values 327-1, 327-2 may represent voltages Vcc or Vcq derived from a functional dependence on the measure of the load impedance or the reflection factor $\Gamma_L$, respectively.

The first and the second digital bias voltage values 327-1, 327-2 extracted from the look-up table 326 are converted into a first analog bias voltage value 329-1, Vramp, and a second analog bias voltage value 329-2, Vcq, by a first and a second digital-to-analog converter 328-1, 328-2, respectively. The DCDC converter 330 of the bias controller 320 is configured to adjust the supply voltage 335, Vcc, of the power amplifier 312 based on the first analog bias voltage value 329-1, Vramp. Here, the first analog bias voltage value 329-1 and the supply voltage 335 in the embodiment of FIG. 3 essentially correspond to the bias information 223 and the supply voltage 225 in the embodiment of FIG. 2, respectively.

In other words, the DCDC converter 330 of the bias controller 320 is configured to adjust the supply voltage 335 of the power amplifier 312 based on a bias information 329-1 determined by a selected entry of a look-up table 326 (LUT A), wherein the bias controller 320 is configured to select an entry of the look-up table 326 based on the determination of the measure 321 of the load impedance.

As shown in the embodiment of FIG. 3, the bias controller 320 is configured to provide a first bias control signal to adjust the supply voltage 335, Vcc, of the power amplifier 312. In addition, the bias controller 320 is configured to further provide a second bias control signal to adjust an input-sided bias voltage 329-2, Vcq, to adjust a quiescent current of the power amplifier 312. Specifically, in the embodiment of FIG. 3, the power amplifier 312 is configured to amplify the RF input signal 305 based on the supply voltage 335 and a quiescent current adjusted by the input-sided bias voltage 329-2 (which input-sided bias voltage may, for example, adjust a gate bias or base bias of an amplifier transistor).

In the embodiment of FIG. 3, the bias controller 320 of the transmit circuit 300 may be configured to control the bias of the power amplifier 312 such that the ACLR value, the EVM value or the saturated power value of the RF output signal lies within a predefined range for a plurality of load impedances provided to the power amplifier 312 by the antenna tuner 130. This ensures that even during the impedance matching process performed by the antenna tuner, the key parameters for describing the radiated performance of the transmit circuit can be maintained.

Furthermore, the bias controller 320 may be configured to provide the bias control signal to adjust the supply voltage 335 of the power amplifier 312 such that a maximum power capability of the power amplifier 312 is altered (e.g., reduced) with improved impedance matching between the power amplifier 312 and the antenna tuner 130.

Thus, in the embodiment of FIG. 3, the antenna tuning system (tuner system 350 including the impedance determinator 322) may provide information about the instantaneous input impedance (which is equal to the power amplifier load impedance) of the antenna tuner (block 130). This impedance can, for instance, be derived by means of the directional coupler 306, which may be part of the antenna tuning system, or by evaluation of voltage levels which are measured at different impedance nodes inside the antenna tuning system. It is pointed out here that the antenna tuning system may provide capabilities to feed back this information to the RF transceiver 340 or baseband IC (or to the bias controller 320 including the impedance information look-up table 324).

The embodiment described with regard to FIG. 3 includes a DCDC converter (block 330). The DCDC converter can be used to set the supply voltage Vcc of the power amplifier. According to embodiments, the DCDC converter can be realized as a buck-only, a boost-only or a buck-boost converter. The supply voltage Vcc applied to the power amplifier 312 determines the output power capability of the power amplifier. The higher the supply voltage is, the higher the maximum output power of the power amplifier is. However, a high supply voltage also leads to a high battery current due to a lower conversion ratio of the DCDC converter. Thus, in one embodiment the supply voltage Vcc is set to a level that should be as low as possible to save battery current, but still high enough to ensure, for example, good ACLR performance under all conditions, or to meet other parameters like saturated power in GMSK (Gaussian Minimum-Shift Keying) mode.

In one embodiment, the DCDC converter 330 is used to maintain an adequate power amplifier performance (e.g. to meet the ACLR or EVM target in 3G or LTE, or to meet the saturated power in GMSK mode) during time intervals in which the power amplifier, for example, may have to cope with a severe load VSWR (Voltage Standing Wave Ratio), that may occur when the antenna impedance is unknown or the tuning system has not yet set the desired power amplifier load impedance. Here, it is to be noted that the tuning process may take some time since the optimization is an iterative process. During the time intervals in which the power amplifier is potentially exposed to a higher load VSWR, the power amplifier supply voltage (i.e. the DCDC converter output voltage) can be set to a higher level that, for instance, ensures good power amplifier linearity even under severe antenna mismatch. When the power amplifier load impedance is being optimized by means of the antenna tuner 130, the DCDC converter 330 can simultaneously reduce the power amplifier supply voltage depending on the impedance information that is reported by the antenna tuning system. The power amplifier supply voltage can, for example, be reduced if the impedance information reported by the antenna tuner 130 indicates that the instantaneous antenna impedance is approaching the desired target impedance. Such a reduction of the power amplifier supply voltage can be made possible since according to embodiments of the invention, the power amplifier 312 needs less power headroom to cope with a mismatch caused by the antenna 308.

In addition to changing the power amplifier supply voltage that can be set by the DCDC converter, the power amplifier quiescent current can also be used to scale the output power capability, as is shown in FIG. 3. The quiescent current can either be set by a control voltage Vcq (shown in FIG. 3) or by an external reference current Iref (not shown) that can be provided by the RF transceiver.

According to the embodiment of FIG. 3, the bias controller 320 is configured to perform the following example steps. Initially, a first bias control signal is provided to set the bias of the power amplifier 312 to a comparatively high level during an initial transmission time interval or after an occurrence of a frequency change in a hopping sequence. Then, the measure 321 of the load impedance provided to the power amplifier 312 by the antenna tuner 130 is determined. Then, a second bias control signal is provided that is different from the first bias control signal to adjust the bias of the power amplifier to a comparatively lower level based on the determination of the measure 321 of the load impedance for a consecutive time interval. Finally, the bias level of the power amplifier 312 is increased by providing an increased bias control signal in response to a detection of a change of the measure 321 of the load impedance that exceeds a predefined threshold.

In the embodiment described with regard to FIG. 3, the bias controller 320 may be configured to set the bias of the power amplifier 312 to the comparatively high level as long as a current measure of the load impedance is unavailable or as long as the load impedance presented to the power amplifier 312 by the antenna tuner 130 has not reached a predetermined impedance region. Additionally, the bias controller 320 may be configured to reduce the bias of the power amplifier 312 as soon as the load impedance presented to the power amplifier 312 by the antenna tuner 130 is brought into the predetermined impedance region by the antenna tuner 130.

For example, the bias controller 320 may be configured to gradually reduce the bias of the power amplifier 312 with a stepwise approximation of the load impedance presented to the power amplifier 312 by the antenna tuner 130 to a target impedance.

In the embodiment of FIG. 3, the bias controller 320 of the transmit circuit 300 (or the impedance information look-up table 324) may be configured to receive frequency information 301. This frequency information may indicate different frequencies of a hopping sequence in a frequency hopping mode of the transmit circuit. For example, the impedance information look-up table 324 may be implemented to use the frequency information 301 for storing the impedance measure data based on a current frequency of the RF input signal in the hopping sequence.

Accordingly, the bias controller 320 may be configured to perform the steps described with regard to the embodiment of FIG. 3 for each frequency of a hopping sequence. Here, each of the frequencies of the hopping sequence such as in the frequency hopping mode may be indicated by the frequency information 301 received by the bias controller 320. Thus, in the embodiment of FIG. 3, the bias controller 320 is configured to provide the bias control signal for the power amplifier 312 based on the frequency information 301.

Furthermore, the bias controller 320 of the transmit circuit 300 may be configured to store, for a plurality of frequencies, measures of the load impedance determined by the bias controller 320, and to reuse the stored measures of the load impedance when returning to a frequency previously used in the hopping sequence.

In accordance with further embodiments, the procedure described above with respect to FIG. 3 may comprise the following example steps. During time intervals in which the antenna tuner 130 does not provide the desired power amplifier load impedance or target impedance (e.g. during a first transmission slot, after a frequency change), the bias of the power amplifier 312 that corresponds to the power amplifier supply voltage and/or power amplifier quiescent current is set to a (comparatively high) level that guarantees an adequate power amplifier performance. The level can be set such that, for example, an ACLR or EVM target in 3G or LTE (Long Term Evolution) or a saturated power in GMSK mode will be met. It has been found that this can also be achieved under severe mismatch conditions. When the power amplifier load impedance (or the impedance at the input of the antenna tuner) starts to approach the desired load impedance by means of the antenna tuner (due to the impedance matching process), the power amplifier bias voltage is changed to account for the new power amplifier load conditions. The power amplifier bias voltage is set based on the instantaneous impedance (measure 321 of the load impedance) that is reported by the tuner system (or the impedance determinator 322) to the RF transceiver (block 340) or baseband IC (within block 302). Based on the reported impedance information, the RF transceiver or baseband IC (or the bias controller 320) sets a power amplifier bias in order to keep an adequate power amplifier performance depending on the instantaneous antenna impedance. The antenna tuner system can, for example, report the impedance information either by means of a serial interface such as MIPI RFFE (RF Frontend control interface) or by one or more analog voltages which, for instance, depend on the magnitude and/or phase of the antenna tuner input impedance. If the antenna tuner 130 reports a significant impedance change, the bias of the power amplifier 312 is set to a secure state to guarantee an adequate power amplifier performance. When the antenna tuner feedback indicates better power amplifier load conditions, the bias of the power amplifier 312 is changed accordingly.

Optionally, if mobile devices operate in frequency hopping mode, the just-mentioned procedure steps can be independently applied to each hopping frequency. This can be achieved by a dedicated table (e.g. LUT B in the embodiment of FIG. 3) that stores the impedance data for each channel.

In a further embodiment, the power amplifier load condition can alternatively be detected by a power amplifier sub-system that may comprise the power amplifier 312 and the DCDC converter 330.

Figure 4:
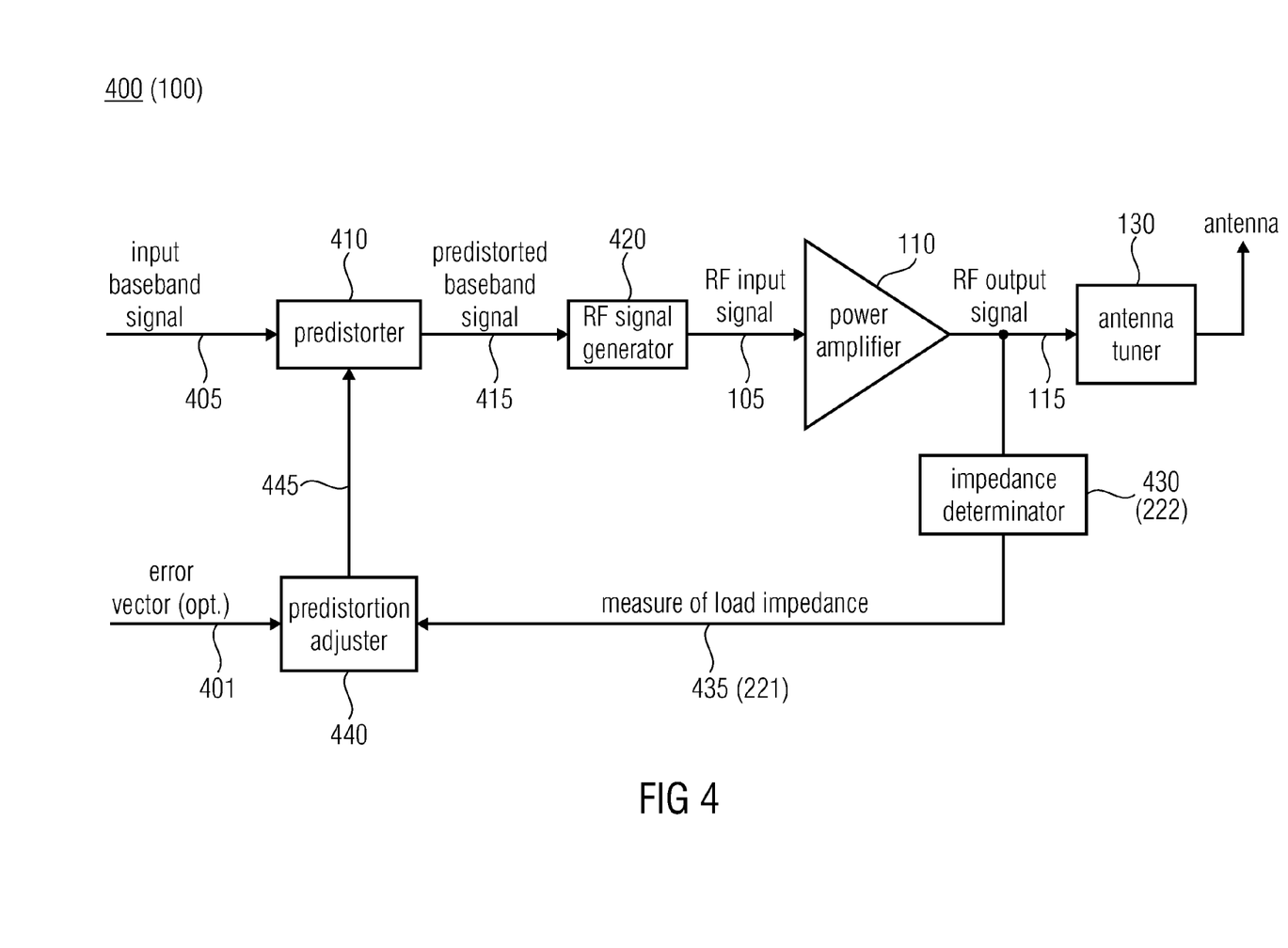
FIG. 4 shows a block diagram of a further embodiment of a transmit circuit including a predistorter and a predistortion adjuster.

FIG. 4 shows a block diagram of a further embodiment of a transmit circuit 400 including a predistorter 410 and a predistortion adjuster 440. Here, the transmit circuit 400 of FIG. 4 essentially comprises the same blocks as the transmit circuit 100 of FIG. 1. Therefore, identical blocks having similar implementations and/or functions are denoted by the same numerals. In the embodiment of FIG. 4, the predistorter 410 is configured to apply a predistortion to an input baseband signal 405 to obtain a predistorted baseband signal 415. Additionally, the transmit circuit 400 of FIG. 4 may comprise an RF signal generator 420 and an impedance determinator 430. The impedance determinator 430 of FIG. 4 may correspond to the impedance determinator 222 of FIG. 2. The RF signal generator 420 is configured to provide the RF input signal 105 for the power amplifier 110. Here, the RF signal generator 420 may be operative on the predistorted baseband signal 415. The impedance determinator 430 is configured to determine the measure 435 of the load impedance provided to the power amplifier 110 by the antenna tuner 130. The measure 435 of the load impedance provided by the impedance determinator 430 as shown in FIG. 4 may correspond to the measure 221 of the load impedance provided by the impedance determinator 222 as shown in FIG. 2. Referring to the embodiment of FIG. 4, the predistortion adjuster 440 is configured to influence a predistortion applied by the predistorter 410 based on the measure 435 of the load impedance. The predistortion applied by the predistorter 410 may be influenced by using a predistortion control signal 445 output by the predistortion adjuster 440. Optionally, the predistortion adjuster 440 of the transmit circuit 400 may be configured to provide the predistortion control signal 445 based on an error vector 401.

Figure 5:
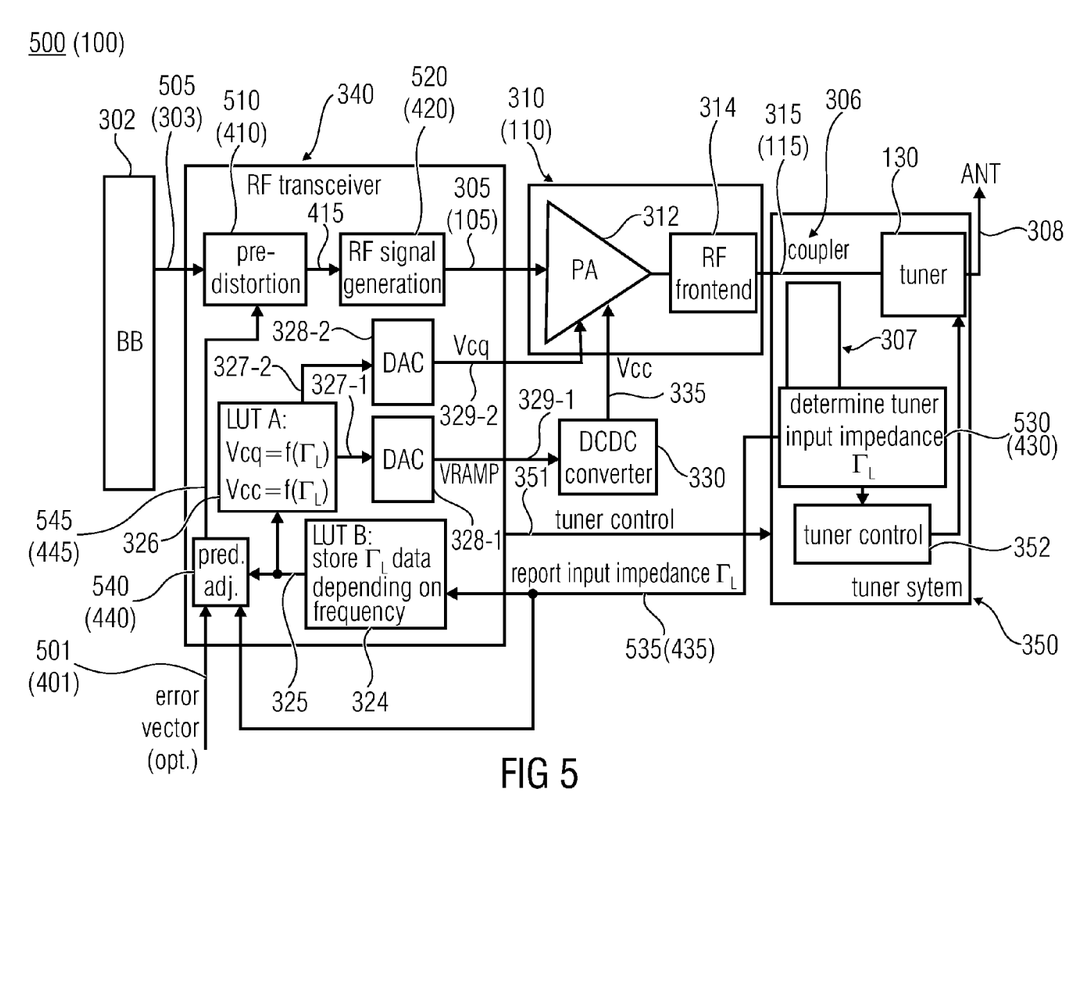
FIG. 5 shows a block diagram of a further embodiment of a transmit circuit including a predistortion adjuster for obtaining updated predistortion coefficients.

FIG. 5 shows a block diagram of a further embodiment of a transmit circuit 500 including a predistortion adjuster 540 for obtaining updated predistortion coefficients. Here, the transmit circuit 500 of FIG. 5 essentially comprises the same blocks as the transmit circuit 300 of FIG. 3 and the transmit circuit 400 of FIG. 4. Therefore, identical blocks having similar implementations and/or functions are denoted by the same numerals. Moreover, the transmit circuit 500 shown in FIG. 5 may comprise the bias controller 320 including the impedance information look-up table 324 (LUT B), the look-up table 326 (LUT A), the first and the second digital-to-analog converters 328-1, 328-2 (DAC) and the DCDC converter 330. The transmit circuit 500 of FIG. 5 furthermore comprises a predistorter 510, an RF signal generator 520, an impedance determinator 530 and a predistortion adjuster 540, that may correspond to the predistorter 410, the RF signal generator 420, the impedance determinator 430 and the predistortion adjuster 440 of the transmit circuit 400 of FIG. 4. Referring to the embodiment of FIG. 5, the impedance determinator 530 is configured to determine the measure 535 of the load impedance from the measurement signal 307 representing, for example, a complex load impedance output by the directional coupler 306. The measure 535 of the load impedance obtained by the impedance determinator 530 of FIG. 5 may correspond to the measure 435 of the load impedance obtained by the impedance determinator 430 of FIG. 4. The supply voltage Vcc, as shown in FIG. 5, may, for example, be provided by the cooperation of the impedance information look-up table 324 (LUT B), the look-up table 326 (LUT A), the DAC 328-1 and the DCDC converter 330.

In the embodiment of FIG. 5, the predistortion adjuster 540 of the transmit circuit 500 is configured to perform the following example steps. First, initial predistortion coefficients are provided for the predistortion based on the measure 535 of the load impedance determined by the impedance determinator 530 during an initial transmission time interval of a sequence of transmission time intervals. Subsequently, predistortion coefficients that are different from the initial predistortion coefficients are set to influence the predistortion applied by the predistorter 510 based on the measure 535 of the load impedance determined by the impedance determinator 530 for a consecutive transmission time interval of the sequence of transmission time intervals.

The predistortion adjuster 540 may be configured to provide the initial predistortion coefficients independent from an error vector. Alternatively, the predistortion adjuster 540 may be configured to obtain updated predistortion coefficients based on the measure 535 of the load impedance and an error vector 501 describing a difference between a reconstructed baseband signal, obtained on the basis of an RF output signal 315 provided by the power amplifier system 310 (or by the power amplifier 312), and the input baseband signal 505. Here, the error vector 501 and the input baseband signal 505 of FIG. 5 may correspond to the error vector 401 and the input baseband signal 405 of FIG. 4. Referring to FIG. 5, the error vector 501 to be (optionally) used by the predistortion adjuster 540 can therefore be derived by comparing the reconstructed baseband signal (e.g. a down-converted, filtered RF output signal) with the input baseband signal (e.g. an I/Q signal).

In the embodiment of FIG. 5, digital predistortion, which is a well-known approach, can be employed to improve the quality of the transmit signal (e.g. the input baseband signal 505) in presence of non-linear effects caused by the power amplifier. It has been found that in accordance with the embodiment of FIG. 5, the knowledge of the antenna impedance can be used to enhance the predistortion algorithm. An underlying concept of the predistortion applied by the predistorter 510 is that the power amplifier output signal or the reconstructed baseband signal is compared (e.g. after a down-conversion, filtering etc.) with the input or modulated baseband signal (e.g. an I/Q signal) that is used to generate the RF signal. The result of the comparison is an error vector 501 that is a function of the amplitude and phase error caused by the nonlinearities in the power amplifier 312. Based on this error vector, predistortion or correction coefficients can be generated by the predistortion adjuster 540 that can, in turn, be used by the predistorter 510 to predistort the baseband signal. It is to be noted that the correction coefficients depend on the antenna impedance since the AMAM and AMPM characteristics of the power amplifier 312 depend on the load impedance. Typically, the predistortion algorithm performed by the predistorter 510 is able to compensate a variable antenna impedance; however this normally requires some iterations. In case of the antenna tuning by the antenna tuner 130, the power amplifier load impedance continuously changes since the antenna tuning system tries to optimize the power amplifier load impedance. Therefore, in order to align the antenna tuning algorithm with the predistortion algorithm, the procedure described above with respect to FIG. 5 can be employed.

Accordingly, the following example steps can be performed by the cooperation of the impedance determinator 530, the predistortion adjuster 540 and the predistorter 510. First, the initial predistortion coefficients are provided that may depend on a first power amplifier load impedance or another parameter that depends on the power amplifier load impedance. Then, during the antenna tuning, the predistortion coefficients are set by means of the calculated error vector and by knowledge of the instantaneous power amplifier load impedance. In an implementation according to FIG. 5, the predistortion can be disabled in case of a fast changing power amplifier load impedance, or generic predistortion coefficients can be used that are less sensitive to changes of the power amplifier load impedance. In a further implementation, the predistortion coefficients can be corrected to minimize the error caused by a changed power amplifier load impedance.

Figure 6:
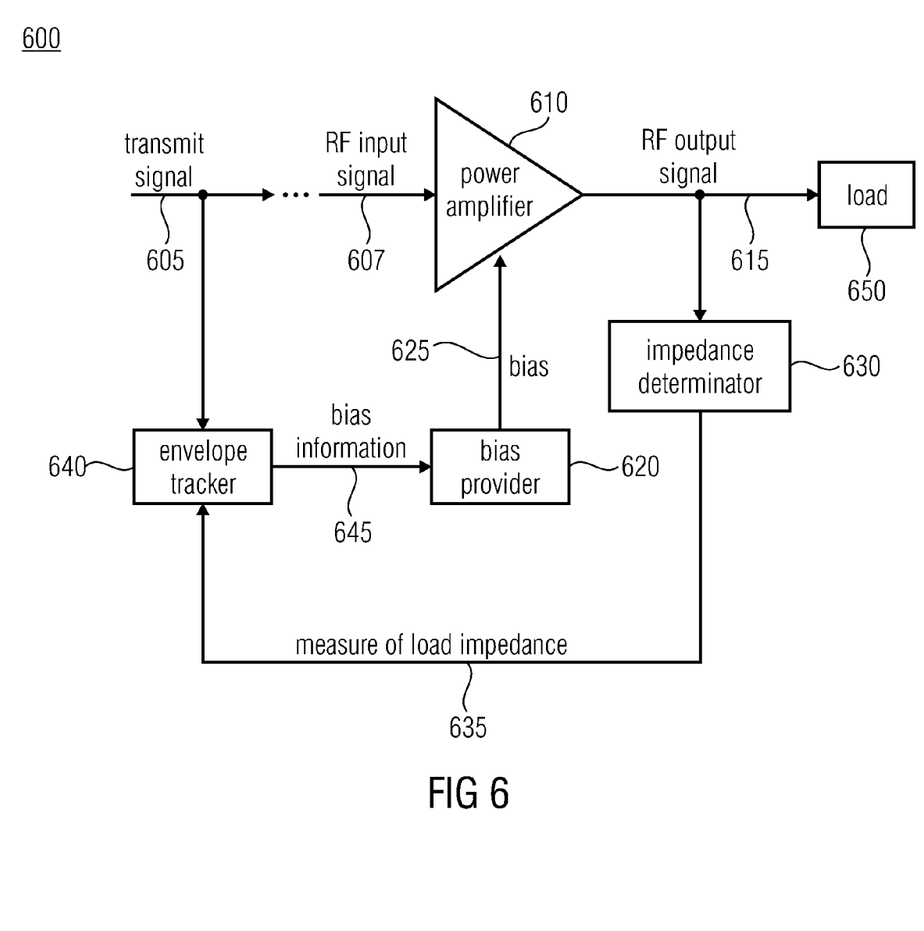
FIG. 6 shows a block diagram of a further embodiment of a transmit circuit including an envelope tracker.

FIG. 6 shows a block diagram of a further embodiment of a transmit circuit 600 including an envelope tracker 640. As shown in FIG. 6, the transmit circuit 600 comprises a power amplifier 610, a bias provider 620, an impedance determinator 630 and an envelope tracker 640. The envelope tracker 640 is configured to determine an envelope of a transmit signal 605 and provide bias information 645 based on the envelope of the transmit signal 605. The power amplifier 610 is configured to obtain an RF output signal 615 based on the transmit signal 605. Similar to the embodiments described above with regard to FIGS. 1 to 5, the power amplifier 610 may be configured to be operative on an RF input signal 607 that is derived from the transmit signal 605, wherein the RF input signal 607 may comprise a plurality of frequencies in specific frequency bands based on the UMTS standard (or may be switchable between a plurality of frequencies). The bias provider 620 is configured to provide a bias 625 for the power amplifier 610 based on the bias information 645. Here, the bias information 645 may represent a ramp voltage for indicating the bias 625, wherein the bias 625 may represent a supply voltage for the power amplifier 610. The bias provider 620 may, for example, be implemented as a DCDC converter configured to provide the bias 625 or the power amplifier supply voltage based on the bias information 645 or the ramp voltage at the output of the envelope tracker 640. The impedance determinator 630 is configured to determine a measure 635 of a load impedance of a load 650 coupled to an output of the power amplifier 610. As opposed to the embodiments described above with regard to FIGS. 1 to 5, the output of the power amplifier 610 in the embodiment of FIG. 6 is not coupled to an input of an antenna tuner but to the load 650. The measure 635 of the load impedance is, for example, a quantity that is dependent on the load impedance, such as a complex-valued reflection factor $\Gamma_L$. Referring to the embodiment of FIG. 6, the envelope tracker 640 is configured to adapt the provision of the bias information 645 based on the measure 635 of the load impedance. Thereby, the envelope tracking performed by the envelope tracker 640 can be significantly improved based on the knowledge of the impedance measure determined by the impedance determinator 630.

Figure 7:
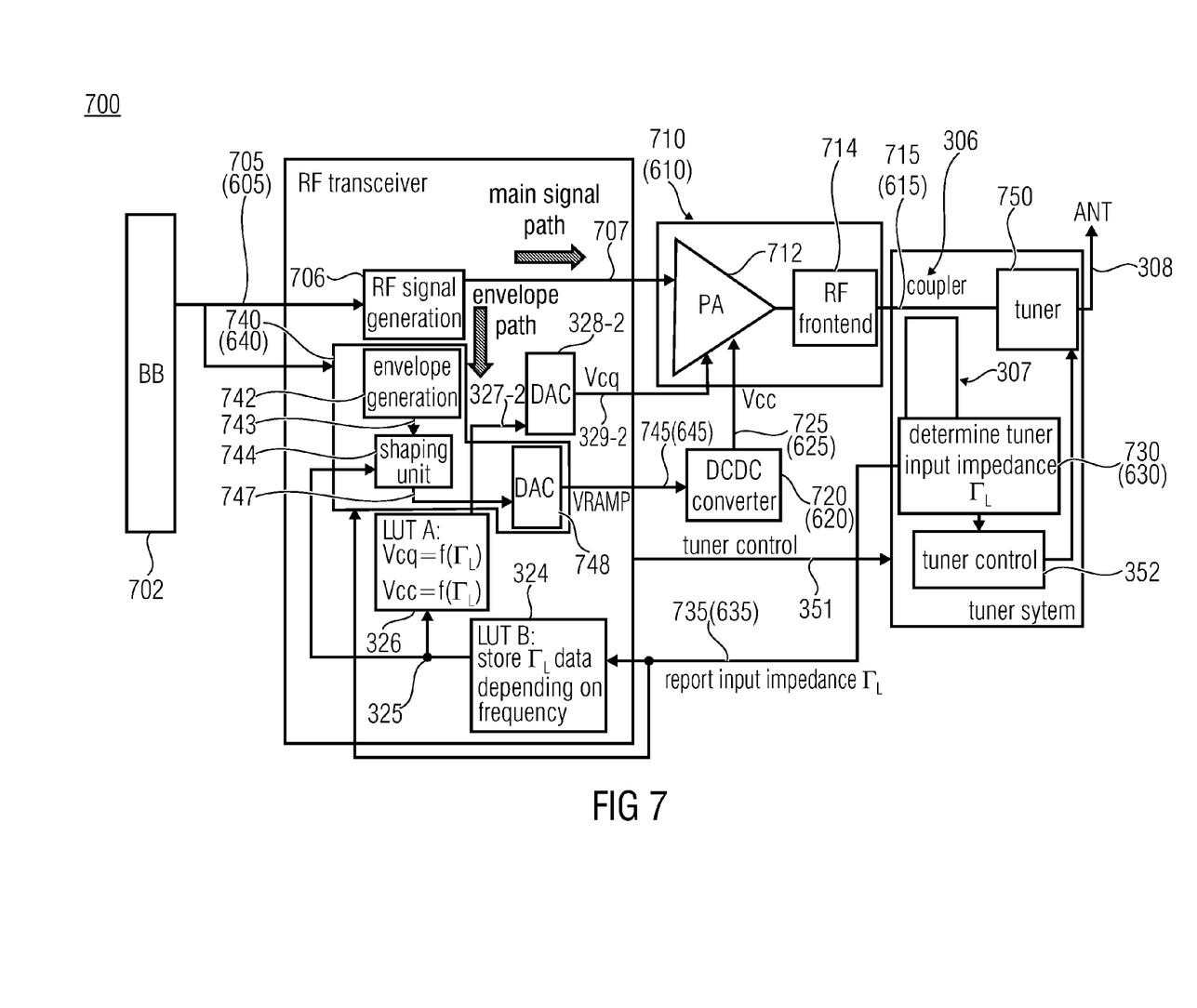
FIG. 7 shows a block diagram of a further embodiment of a transmit circuit including an envelope tracker with an envelope shaping unit.

FIG. 7 shows a block diagram of a further embodiment of a transmit circuit 700 including an envelope tracker 740 with an envelope shaping unit 744. The transmit circuit 700 of FIG. 7 comprises a power amplifier system 710, an impedance determinator 730, an envelope tracker 740 and an antenna tuner 750. Here, the blocks 710, 730 and 740 as shown in FIG. 7 may correspond to the blocks 610, 630 and 640 of FIG. 6. In the embodiment of FIG. 7, the transmit circuit 700 comprises a baseband generator 702, an RF signal generator 706, the power amplifier system 710 and the antenna tuner 750, thereby defining a main signal path. The baseband generator 702 is configured to generate a baseband signal 705 as the transmit signal. The RF signal generator 706 is configured to generate an RF signal 707 from the baseband signal 705. The power amplifier system 710 may comprise a power amplifier 712 and an RF frontend 714. As shown in FIG. 7, the power amplifier system 710 (or the power amplifier 712) is configured to obtain an RF output signal 715 based on the transmit signal 705. In addition, the input of the antenna tuner 750 is coupled to an output of the power amplifier 710. The antenna tuner 750 is configured to transform an antenna impedance (at an antenna 308) to an impedance at the input of the antenna tuner 750. Thus, by the cooperation of the baseband generator 702, the RF signal generator 706, the power amplifier system 710 and the antenna tuner 750, a main signal path is provided.

Additionally, the impedance determinator 730 is configured to determine the measure 735 of the load impedance based on a measurement signal 307 (e.g. a signal representing a complex load impedance) obtained by a directional coupler 306. Similar to the embodiments of FIGS. 1 to 5, the input-sided bias voltage (Vcq) of the power amplifier 712 can be controlled by the cooperation of an impedance information look-up table 324, a look-up table 326 and a digital-to-analog converter 328-2 based on the determined impedance measure 735. Here, the components 306, 324, 326 and 328-2 of FIG. 7 may correspond to the components of FIG. 3, which are referenced by the same numerals. In addition, the transmit circuit 700 of FIG. 7 may comprise an envelope tracker 740 for providing bias information 745, such as a ramp voltage Vramp, based on the envelope of the transmit signal 705. The transmit circuit 700 may furthermore comprise a DCDC converter 720 for providing a bias 725, such as the supply voltage Vcc of the power amplifier 712 based on the bias information 745, Vramp. In the embodiment of FIG. 7, the DCDC converter 720 may be implemented as a special DCDC converter, such as an ET (Envelope Tracking) DCDC converter. The envelope tracker 740 and the DCDC converter 720 shown in FIG. 7 may correspond to the envelope tracker 640 and the bias provider 620 shown in FIG. 6. Together, the envelope tracker 740 and the DCDC converter 720 of FIG. 7 define an envelope path within the transmit circuit 700.

For the envelope path, the envelope tracker 740 may comprise an envelope generation unit 742, an envelope shaping unit 744 and a digital-to-analog converter 748. The envelope generation unit 742 is configured to generate the envelope 743 of the transmit signal from the baseband signal 705 provided by the baseband generator 702. The envelope shaping unit 744 is configured to shape the envelope 743 of the transmit signal by using a shaping characteristic that depends on the measure 735 of the load impedance provided to the power amplifier 712 by the antenna tuner 750. At the output of the envelope shaping unit 744, an analog signal 747 representing the shaped envelope may be obtained, which can be converted into a digital signal representing the bias information 745, Vramp, by a digital-to-analog converter 748. The supply voltage Vcc at the output of the DCDC converter 720 is provided based on the digital signal 745 obtained from the DAC 748. Thus, by the use of the envelope tracker 740 and the DCDC converter 720, a shaping characteristic for shaping the envelope of the transmit signal can be improved based on the knowledge of the determined measure 735 of the load impedance provided, such as during an impedance matching. In accordance with the embodiments described above with regard to FIGS. 6 and 7, an improved envelope tracking (ET) is provided within a transmit circuit. Specifically, it has been found that the knowledge of the antenna impedance can be used to enhance the envelope tracking algorithm performed by the envelope tracker. By such an envelope tracking approach, an improved RF amplifier design can be implemented in which the power supply voltage applied to the power amplifier can be constantly (or variably) adjusted to ensure that the amplifier is operating at peak efficiency for the given instantaneous output power requirements.

In the envelope tracking according to the embodiment of FIG. 7, the power supply voltage to the power amplifier is not constant. Instead, the power supply voltage to the power amplifier can be changed depending on the instantaneous envelope of the (modulated) baseband signal. In embodiments, the envelope of the (modulated) baseband signal can be calculated by means of a CORDIC (Coordinate Rotation Digital Computer) algorithm. This can be followed by a delay adjustment to compensate a different delay in the main signal path (RF signal generation path) and the envelope path. Then, the envelope signal can be shaped (predistorted) and finally digital-to-analog converted. The thus obtained signal can be fed to the ET DCDC converter (special DCDC converter) that generates the variable power supply for the power amplifier. Similar to predistortion as described with regard to FIGS. 4 and 5, the envelope shaping characteristic can be applied depending on the power amplifier load impedance. As opposed to known envelope tracking approaches, that are based on a feed-forward implementation, the power amplifier output signal can advantageously be used to adapt the shaping function or shaping characteristic applied by the envelope shaping unit. Since the power amplifier load impedance is known by the impedance determinator, the shaping function does not need to compromise all the potential power amplifier load impedances.

According to embodiments, this knowledge of the load impedance can be used to optimize the shaping characteristic and thus to reduce the battery current consumption. In addition, the shaping characteristic can be adapted whenever a new power amplifier load impedance is effective due to the antenna tuning algorithm.

Some embodiments according to the invention provide a better performance than conventional 3G mobile devices that use an isolator to keep good ACLR performance under antenna mismatch. The isolator resolved the linearity degradation under antenna mismatch, but had severe impact on size and cost. The increasing number of bands aggravated the cost and size disadvantage of the isolator approach. As a result, the isolator was removed from most of the designs and eliminated by other approaches that shall also provide a load-insensitive behavior. Today, balanced power amplifiers are the most important class of load insensitive power amplifier solutions. There are some design variants depending on the power amplifier supplier, but all implementations rely on a 90 deg hybrid as a core element to reduce the load sensitivity. One major disadvantage of each balanced power amplifier is that the load insensitivity is gained at the expense of a lower power amplifier efficiency due to additional losses caused by the hybrid network. The peak efficiency of a balanced amplifier is typically in the range of 35-37%, whereas a single ended power amplifier is more than 40%.

Some embodiments according to the invention provide a better tradeoff between efficiency and complexity than amplifiers having more headroom. It has been found that it is often a less effective approach to use a single-ended amplifier with more headroom of linear output power. Due to the extra linear power, the ACLR degradation under mismatch is reduced. The advantages compared to a balanced power amplifier are less complex hardware, which allows more cost effective and smaller size solutions. However, the impact on efficiency is even more severe than in case of a balanced power amplifier if the same ALCR performance under mismatch for both architectures is presumed.

Some embodiments according to the invention provide a better performance than conventional antenna tuning systems. The use of an antenna tuner has become more and more popular. The antenna tuner is basically an impedance matching network with at least two different states that transforms the antenna impedance to an impedance value at the input of the tuner which is closer to the optimum load impedance of the power amplifier (normally 50 Ohm). The antenna tuner reduces the mismatch loss at the antenna input in order to increase the power delivered to the antenna sub-system which shall consist of a tuner and an antenna. It does not change the antenna efficiency itself which is the ratio of the actually radiated power and the power delivered to the antenna sub-system. Thus, the main effect of an antenna tuner is the increase of the power delivered to the antenna sub-system. Nevertheless, depending on the mismatch loss, the antenna tuner can achieve a 1 . . . 2 dB increase of radiated power. Today's antenna tuners provide many different impedance states and can cover a big tuning range which is here defined as the antenna impedance range which can be mapped to a 50 Ohm impedance at the input of the tuner.

However, usually, antenna tuners operate in an open loop way. This means that the tuner state is set depending on one or more instantaneous and known states of the mobile terminal such as the transmit/receive frequency and mechanical state of the phone (e.g. slider position). The antenna impedance itself is usually unknown. Thus, the achievable improvement is most of the time not optimum since the actual antenna impedance changes due to the user specific handling of the mobile terminal (e.g. how the device is touched during the call). It has been found that it is possible to improve the benefit of the antenna tuner if the tuner state can be set depending on the actual antenna impedance. This requires additional means that detect the instantaneous antenna impedance or tuner input impedance that is a function of the antenna impedance. According to some embodiments, the power amplifier design can be relaxed (which also means lower cost), since in a closed loop antenna tuning system, the load VSWR effective at the power amplifier output is reduced and prevents severe VSWR conditions. However, this can only be achieved if the antenna tuning system has sufficient time to optimize the power amplifier load impedance. Usually, this condition is, for instance, not fulfilled at a first transmit interval where the antenna impedance is unknown, after a frequency change or after a transmission idle phase that is long enough so that antenna impedance may change. As long as the tuner system does not provide the desired power amplifier load conditions, the power amplifier may have to cope with severe load VSWR. However, embodiments of the invention, offer a solution how to keep the key parameters (e.g. ACLR or EVM for a linear system, or power delivered to the antenna for a GMSK based mobile terminal) even during time intervals for which the antenna tuner cannot provide the desired power amplifier load impedance.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, that are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processor, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In summary, embodiments of the invention offer an attractive solution for a problem which occurs in mobile terminals based, for example, on 8PSK/GMSK (8-Phase Shift Keying/Gaussian Minimum Shift Keying), WCDMA or LTE, which employ an antenna tuner to improve the radiated performance.

Embodiments of the invention provide a procedure for setting the power amplifier bias depending on an impedance value which is reported by the tuner system.

Embodiments of the invention have the advantage that the impedance information can be used to change the predistortion characteristic.

According to embodiments of the invention, it is possible to use the impedance information to change the shaping characteristic in an envelope tracking system.

What is claimed is:

1. A transmit circuit, comprising:
   an envelope detection circuit configured to detect an envelope of a transmit signal;
   an impedance sensor configured to measure a load impedance;
   an envelope shaping circuit configured to shape the envelope of the transmit signal based at least partly on the measured load impedance;
   circuitry configured to generate a supply voltage based on the envelope of the transmit signal and the measured load impedance; and
   a power amplifier configured to generate a radio frequency output signal based on the transmit signal, wherein the power amplifier is powered at least partially by the supply voltage.

2. A transmit circuit, comprising:
   an envelope detection circuit configured to detect an envelope of a transmit signal;
   an impedance sensor configured to measure a load impedance;
   an envelope shaping circuit configured to shape the envelope of the transmit signal using a shaping characteristic that depends on the measured load impedance;
   circuitry configured to generate a supply voltage based on the envelope of the transmit signal and the measured load impedance; and
   a power amplifier configured to generate a radio frequency output signal based on the transmit signal, wherein the power amplifier is powered at least partially by the supply voltage.

3. The transmit circuit of claim 1 wherein the impedance sensor comprises a directional coupler coupled to an output terminal of the power amplifier.

4. The transmit circuit of claim 1 wherein the impedance sensor comprises a directional coupler coupled between an output terminal of the power amplifier and an antenna.

5. The transmit circuit of claim 1, wherein the circuitry further comprises a DCDC converter configured to adjust the supply voltage of the power amplifier based on the envelope of the transmit signal and the measured load impedance.

6. The transmit circuit of claim 1, wherein the circuitry is further configured to control the supply voltage of the power amplifier to generate an adjacent channel leakage power ratio value, an error vector magnitude value, or a saturated power value of the radio frequency output signal that lies within a predefined range for a plurality of load impedances that are provided to the power amplifier.

7. The transmit circuit of claim 1, further comprising:
   a predistorter configured to apply a predistortion to an input baseband signal to obtain a predistorted baseband signal;
   a radio frequency signal generator configured to send the transmit signal for the power amplifier based on the predistorted baseband signal; and
   a predistortion adjustment circuit configured to adjust the predistortion applied by the predistorter based on the measured load impedance.

8. The transmit circuit of claim 2 wherein the impedance sensor comprises a directional coupler coupled to an output terminal of the power amplifier.

9. The transmit circuit of claim 2 wherein the impedance sensor comprises a directional coupler coupled between an output terminal of the power amplifier and an antenna.

10. The transmit circuit of claim 2, wherein the circuitry further comprises a DCDC converter configured to adjust the supply voltage of the power amplifier based on the envelope of the transmit signal and the measured load impedance.

11. The transmit circuit of claim 2, wherein the circuitry is further configured to control the supply voltage of the power amplifier to generate an adjacent channel leakage power ratio value, an error vector magnitude value, or a saturated power value of the radio frequency output signal that lies within a predefined range for a plurality of load impedances that are provided to the power amplifier.

12. The transmit circuit of claim 2, further comprising:
   a predistorter configured to apply a predistortion to an input baseband signal to obtain a predistorted baseband signal;

a radio frequency signal generator configured to send the transmit signal for the power amplifier based on the predistorted baseband signal; and a predistortion adjustment circuit configured to adjust the predistortion applied by the predistorter based on the measured load impedance.

* * * * *